United States Patent [19]

Liegel et al.

[11] Patent Number: 4,961,001
[45] Date of Patent: Oct. 2, 1990

[54] METHOD FOR COMPENSATING FOR ENVIRONMENTAL PARAMETERS ON THE IMAGING CHARACTERISTICS OF AN OPTICAL SYSTEM

[75] Inventors: Jürgen Liegel, Oberkochen; Martin Krautter, Heidenheim, both of Fed. Rep. of Germany

[73] Assignee: Carl-Zeiss-Stiftung, Heidenheim, Fed. Rep. of Germany

[21] Appl. No.: 254,433

[22] Filed: Oct. 6, 1988

[30] Foreign Application Priority Data

Oct. 7, 1987 [DE] Fed. Rep. of Germany ....... 3733823

[51] Int. Cl.$^5$ .......................... G01J 1/00; G01N 21/00
[52] U.S. Cl. .............................. 250/491.1; 250/492.2
[58] Field of Search .......................... 250/492.2, 491.1; 215/121.62, 121.81

[56] References Cited

U.S. PATENT DOCUMENTS

| | | | |
|---|---|---|---|
| 4,154,530 | 5/1979 | Connolly et al. | 219/121.82 |
| 4,182,024 | 1/1980 | Cometta | 219/121.62 |
| 4,543,486 | 9/1985 | Rose | 219/121.62 |
| 4,666,723 | 5/1987 | Shimizu et al. | 355/55 |
| 4,769,680 | 9/1988 | Resor et al. | 355/43 |

Primary Examiner—Bruce C. Anderson
Attorney, Agent, or Firm—Walter Ottesen

[57] ABSTRACT

In a system for imaging an original with high precision into an image plane by utilizing narrow-band radiation, environmental parameters become that much more disturbing the finer the structure which is to be imaged becomes. Various environmental parameters such as air pressure change the refractive index of the air so that the ratio of this refractive index to the refractive index of the material of the imaging system is changed with reference to the ratio forming the basis of the computation. This causes a deterioration of the imaging. The method of the invention makes it possible to maintain the imaging characteristics of the system constant in that at least one system parameter is changed. The dependency of this system parameter on the environmental parameter to be compensated is determined and stored. Pursuant to the method, the environmental parameter is continuously measured during operation of the system and in combination with the stored values, a signal is obtained for providing a compensating adjustment of the system parameter. The invention is especially applicable in the area of microlithography.

16 Claims, 4 Drawing Sheets

METHOD FOR COMPENSATING FOR ENVIRONMENTAL PARAMETERS ON THE IMAGING CHARACTERISTICS OF AN OPTICAL SYSTEM

FIELD OF THE INVENTION

The invention relates to a method for compensating for the influence of environmental parameters on the imaging characteristics of an optical system which utilizes narrow-band radiation for imaging an original such as artwork into an image plane. The invention also relates to an apparatus for carrying out the method.

BACKGROUND OF THE INVENTION

A compensating method of the kind referred to above is primarily utilized in the area of microlithography. Masks are illuminated by laser radiation and imaged onto a silicon wafer by means of an optical system. Such systems must image structural sizes of 0.5 to 1.0 $\mu m$ with high precision and changes of environmental parameters such as temperature and air pressure lead to a noticeable deterioration of the imaging in such systems.

Apparatus for microlithography are used for producing integrated circuits. Such apparatus are generally operated in climatized rooms at constant temperature. An additional stabilization of air pressure is not provided since the size of the apparatus would require a very complex and costly pressure chamber which does not appear to be economically justifiable. For this reason, the production of integrated circuits with such apparatus is either discontinued when certain air pressure limits are exceeded or one of the following methods are utilized:

(1) Rinsing the image forming objective and/or the object and image chamber with gases and specifically with (a) helium since the change of index of refraction of this gas reacts relatively little to environmental changes, or (b) with an oxygen/nitrogen mixture with the adjustment of the mixture ratio being utilized for air pressure compensation; and, (2) Readjusting of the object and image planes so that the linear magnification remains constant.

Rinsing with gas has the disadvantage that special preconditions as to the seal tightness of the area which is rinsed with gas must be satisfied and thereby a relatively large effort is required. The readjustment means an interruption of production and thereby causes a reduction of the usable operating time. Furthermore, this control can be carried out only within narrow limits since it is accompanied by noticeable distortions.

SUMMARY OF THE INVENTION

It is an object of the invention to provide an automatic compensation for the influence of environmental parameters on the imaging characteristics for systems which image an original into an imaging plane with high precision utilizing narrow-band radiation.

The method of the invention is for compensating for the influence of environmental parameters on the imaging characteristics of a system for imaging an original into an image plane by utilizing narrow-band radiation, the method comprising the steps of: first determining the influence of at least one of the environmental parameters on the imaging characteristics and storing the same in the form of stored values; continuously measuring the one environmental parameter during operation of the system; converting the one environmental parameter into a positioning quantity by means of the stored values; and, influencing a part of the system with the positioning quantity so as to cause the imaging characteristics to be maintained constant with a high precision.

The method of the invention can be used everywhere with success where narrow-band radiation is to be imaged by means of optical systems wherein these systems are subjected to strong environmental influences which noticeably deteriorate the imaging characteristics. The method of the invention together with an apparatus for carrying out the method are described in the material that follows.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
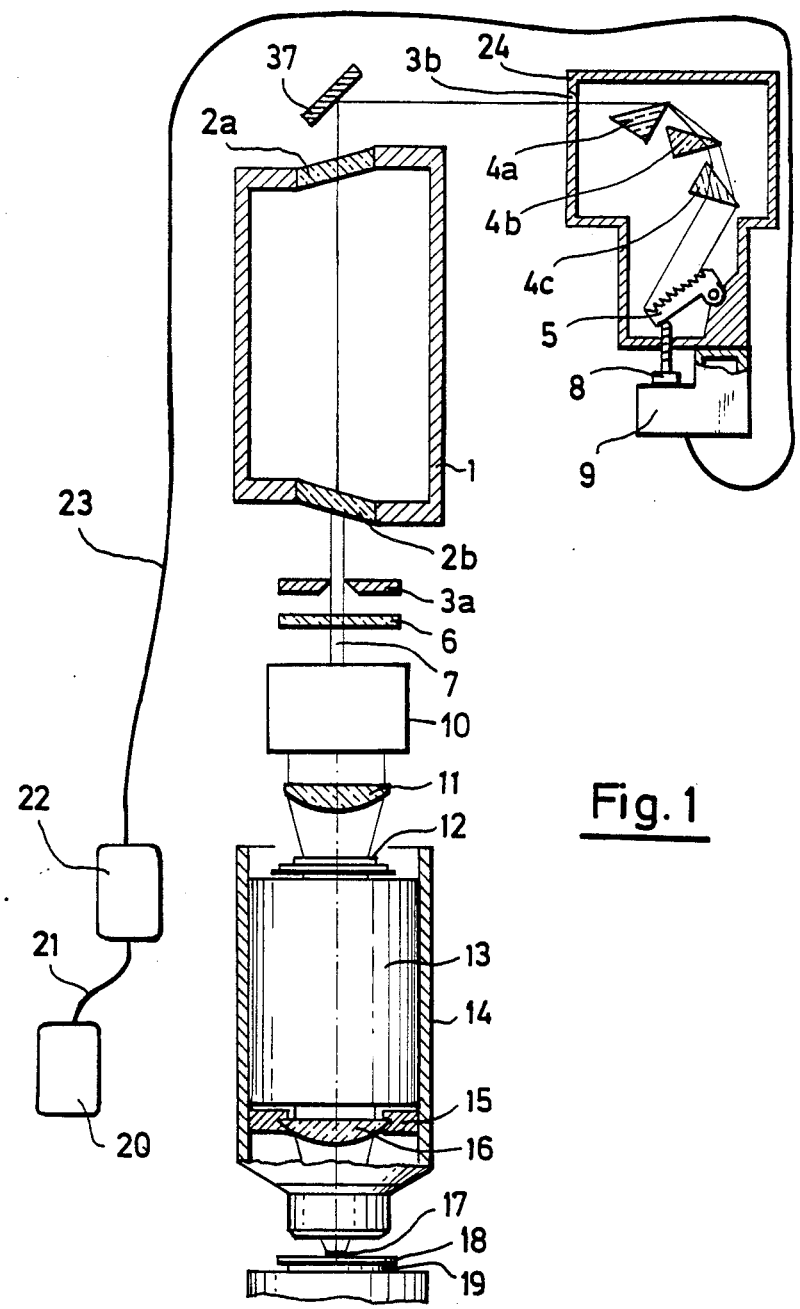
FIG. 1 is a first embodiment according to the invention wherein compensation is achieved by readjusting the wavelength of the laser in the context of a wafer stepper.

In all FIGS., wafer steppers are shown which are used for manufacturing integrated circuits and image an appropriately configured original onto a wafer. In wafer steppers, this original is more generally known as artwork.

If circuits are to be produced having structural dimensions of approximately 0.5 $\mu m$, it is necessary to use light having a short wavelength for imaging. This light must be of an extremely narrow band so that the optical system utilized for imaging the artwork onto the wafer has the required optical imaging characteristics. The parameters of a wafer stepper for generating structures having 0.5 $\mu m$ dimensions can be, for example, as follows:

Wavelength < 300 nm
Numerical aperture NA > 0.35
Field Diameter ≧ 14.5 mm
Linear Magnification 1/5
Resolution: 0.5 $\mu m$ Coherent radiation in the medium to high ultraviolet can be generated by gas lasers or dye lasers having frequency multipliers with the gas lasers being preferred because of their high output capacity and their high efficiency. The most important gas molecules for the generation of ultraviolet radiation are rare gas molecules (excimer) or rare gas halogenides (exciplexes). An exciplex laser of the KrF type has a wavelength of approximately 248.5 nm, which corresponds to a frequency of 1.2 PHz, and a spectral bandwidth of approximately ±0.5 nm which is reduced by means of a monochromator in the resonance region to approximately 2 pm. If concave-grating monochromators having approximately 1500 L/mm and a diameter of 40 mm are utilized, a spectral bandwidth $\Delta\lambda$ of 5 pm at $\lambda = 248.5$ nm is obtained. As an average power, 200 mJ.250 Hz=50 W can be obtained today with such lasers.

Objectives for wafer steppers require an illumination having a light-transmitting value diameter of at least approximately 15 mm. In the event that structures are to be imaged having a magnitude of $\leq 0.5$ μm, a wavelength of $<300$ nm, for example a wavelength of 248.5 nm, is utilized. The imaging systems, or more specifically, the objectives used in such wafer steppers mostly contain lenses made of quartz with all lenses of the objective being made of the same material. A further usable material is, for example, calcium fluoride. The index of refraction $n_L$ of air which surrounds the wafer stepper and therefore also the objective has a certain dependency on air pressure. Even very small changes of the index of refraction $\Delta n_L$ ($\Delta n_L$: change of index of refraction of air because of $\Delta\lambda$ and air pressure changes $\Delta p$) operate in a disadvantageous manner on the imaging characteristics of the objective with respect to the precision of the structures to be imaged. This situation is present because the refractive index ratio $n_M:n_L$ is changed which forms the basis of the computation of the objective wherein: $n_M$ equals the refractive index of the lens material.

The problem of the air pressure dependency of the imaging characteristics of objectives for microlithography becomes more critical with increasing fineness of the structure to be imaged. With a structure magnitude of $d_{min}=1.0$ μm, an air pressure-induced change of the image magnitude by $V_L=0.1$ μm is still tolerable, however, for $d_{min}=0.5$ μm, the change in the image magnitude must be $V_L \leq 0.05$ μm.

As mentioned above, it is not possible or at least not possible for a justifiable effort to maintain the air pressure for wafer steppers constant so that the distortion $V_L$ is maintained beneath the extreme low limit value.

For this situation, the method of the invention offers relief by influencing a part of the system by means of its own positioning quantity such that the imaging characteristics of the system are maintained constant to a high precision. Stated otherwise, the influence of the environmental parameter can be compensated without having to influence this parameter itself.

In the following, the compensation of the influence of air pressure is explained as an example. This compensation starts from the premise that although all materials have a dispersion (that is a dependency of their refractive index n on the wavelength); the dispersion of air is, however, very much less than that of optical materials. This fact is utilized in that the wavelength $\lambda$ of the light is changed to compensate for the air pressure dependent change of the refractive index of air. This compensation is explained in the following.

The computation of the objective is based upon the ratio of the refractive index value $n_M:n_L$ measured at normal conditions (20° C., 1013 mbar). However, this ratio must be seen as the following ratio:

$$\frac{n'_M(\lambda)}{n'_L(\lambda, p)} = \frac{n_M + \Delta n_M(\Delta\lambda)}{n_L + \Delta n_L(\Delta\lambda, \Delta p)} = \frac{n_M}{n_L}$$

wherein: p=air pressure; and $\Delta n_M$=refractive index change of the optical materials based on a wavelength change $\Delta\lambda$.

From the above, it follows that the refractive index ratio $n_M:n_L$ can be maintained constant when the following is provided:

$$\Delta n_M(\Delta\lambda)/n_M = \Delta n_L(\Delta\lambda, \Delta p)/n_L$$

Since the dispersion of air, that is $\Delta n_L(\Delta\lambda)$, is very much less than the dispersion of optical materials, the following can be written:

$$\Delta n_M(\Delta\lambda)/n_M = \Delta n_L(\Delta p)/n_L$$

From this, it becomes manifest that the disadvantageous influence of air pressure on the refractive index of the surrounding air can be compensated for by means of a wavelength adjustment of $\Delta\lambda$.

The required wavelength shift $\Delta\lambda$ in dependence upon the air pressure $\Delta p$ can be computed and inputted into a positioning-quantity computer as a storage value. In dependence upon the value $\Delta p$, the computer computes a quantity for adjusting the member of the light source determining the wavelength in such a manner that the value of $\Delta\lambda$ required for compensation is adjusted to every value of $\Delta p$.

Normally, it is simpler to first provide a calibration operation in which $\Delta\lambda$ is determined in dependence upon $\Delta p$ and to store the values so obtained in the positioning-quantity computer. For this purpose, the longitudinal focus or the linear magnification of the objective can, for example, be determined and can be maintained constant for a change $\Delta p$ of the air pressure by means of readjusting the wavelength of the light source with the positioning quantity being obtained directly.

As a further environmental parameter, the air moisture also has an influence on the refractive index $n_L$ of the air. This influence does not generally have to be considered when the relative humidity can be held constant with a fluctuation latitude of approximately $\pm 10\%$. If this is not obtained or if still finer structures are to be imaged, it can be recognized from the foregoing that a compensation of the influence of the humidity is possible, for example, by readjusting the wavelength $\lambda$ of the radiation source.

Further quantities which have to be noted and compensated for as may be required are the following: the temperature dependency of the refractive index $n_M$; the temperature dependent deformation of the objective mount; the temperature dependent deformation of the refracting surfaces caused by material expansion; and, the composition of the air.

All environmental parameters which have an impermissibly large influence on the imaging characteristics of an objective can be compensated for pursuant to the method of the invention in that the imaging characteristics of the objective are held constant with high precision. In this connection, every compensation is so carried out that the refractive index ratio $n_M:n_L$ forming the basis of the computation is held constant.

FIG. 1 is a schematic representation of a wafer stepper. The laser medium 1, for example a rare gas halogen mixture, is bounded by two exit windows (2a, 2b). The exiting beam of the one window 2a enters a monochromator 24 which in this embodiment comprises three expansion prisms (4a, 4b, 4c) and a reflection grating 5. The inclination of the reflection grating 5 is changeable by means of an adjusting screw 8 whereby the wavelength of the spectral reflecting radiation within a desired wavelength interval can be continuously changed. A positioning motor 9 for the adjusting screw 8 permits a remote handling. The laser beam 7 exiting through the other exit window 2b enters the region of the refraction optics (10, 11, 13) through a diaphragm 3a and an out-coupling mirror 6.

In the refraction optics, the laser radiation 7 is imaged on an object carrier 12 by means of an expansion optic 10 and a field lens 11 with the object carrier 12 supporting the artwork to be imaged. The imaging optic 13 in FIG. 1 is schematically represented as a block in an optic housing 14 and a lens 16 disposed in a lens holder 15. The image of the artwork on the image carrier 12 is imaged onto a wafer 17 on a wafer support 18 by means of the imaging optic 13. The wafer support 18 is displaceable in the x-y direction by means of a wafer positioning device 19.

Changes in the environmental parameters such as air pressure generate a signal in a measuring device 20 for environmental parameters. This signal is supplied via a connecting cable 21 to a positioning-quantity computer 22 if the measuring apparatus 20 can not be accommodated together in the same housing with the positioning-quantity computer 22 for reasons of spatial flexibility.

From the data of the measuring device 20, the positioning-quantity computer 22 computes the desired position for the positioning motor 9 of the adjusting screw 8 which is transmitted via a connecting cable 23. The deflection mirror 37 ahead of the monochromator 24 is provided simply to reduce the structural length of the laser.

By means of the signal generated by the computer 22, the adjusting screw 8 of the monochromator 24 is actuated thereby effecting a change of the wavelength λ of the laser 1. The adjusting screw 8 is actuated until the disadvantageous influence of the environmental parameter measured by device 20 on the imaging quality of the objective 13 is compensated. In this way, a good imaging of the artwork onto a wafer 17 on the object carrier 12 is assured without the necessity of interjection by service personnel.

In addition to the monochromator 24 described, it is understood that also every other monochromator can be utilized which has an adequately large resolution. For this, the special magnitude of the diameter of the laser beam must be considered.

The positioning quantities resulting from the changes of the environmental parameters can, as mentioned, be determined in advance by means of a calibration operation and be inputted to the computer as a computation basis with hardware as well as software solutions leading to a satisfactory result.

Figure 2:
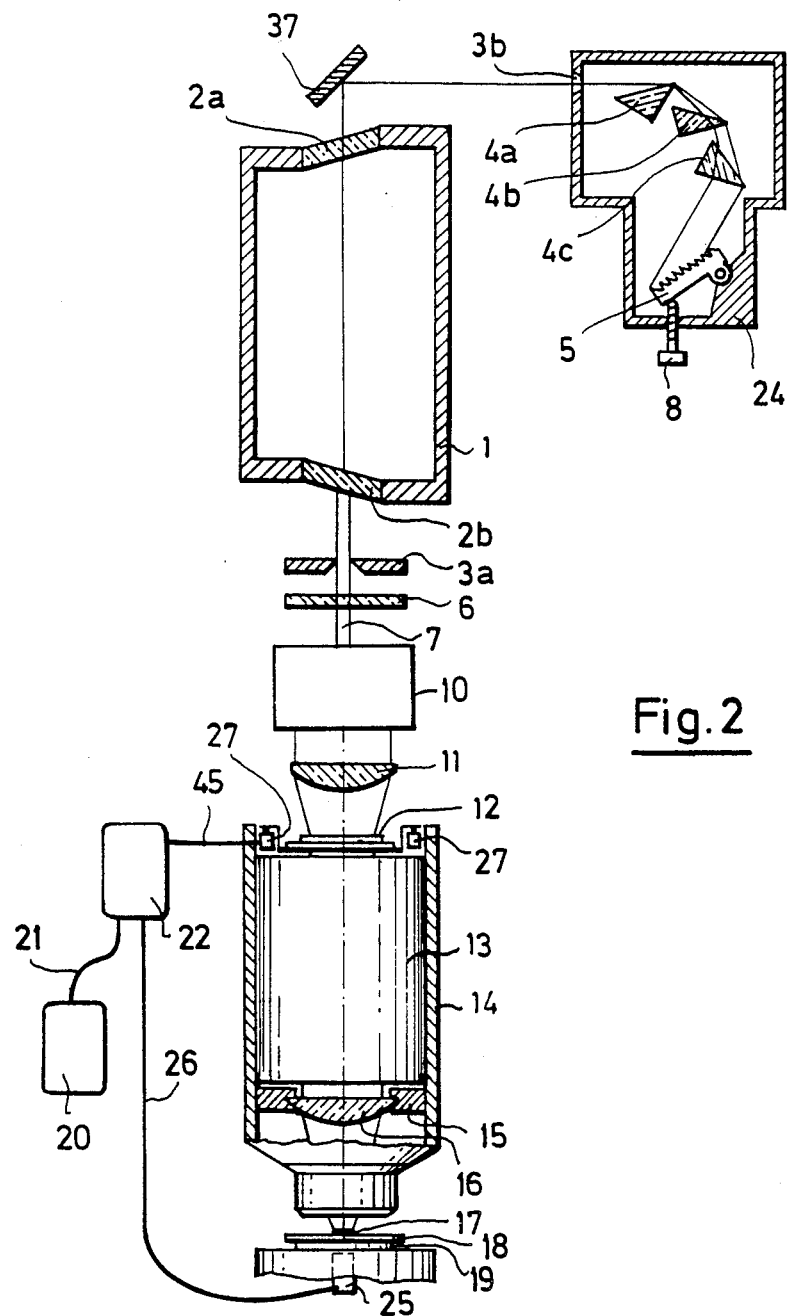
FIG. 2 is a second embodiment of the invention wherein the compensation is provided by means of the adjustment of the object and image planes again in the context of a wafer stepper.

Another compensating possibility is shown in FIG. 2 in connection with the wafer stepper shown schematically therein. Here too, the data of the measuring device 20 for environmental parameters are processed in the positioning-quantity computer 22 but to then vary the object carrier 12 via the step motors 27 and the wafer support 18 in elevation via the piezoelectric crystal lifters 25, so that the linear magnification and the imaging quality can be maintained. The control data are transmitted via connecting cables (26, 45) in the illustrated embodiment. These compensations controlled from the measured environmental parameters also permit the automatic utilization of the wafer stepper over long periods of time.

Figure 3:
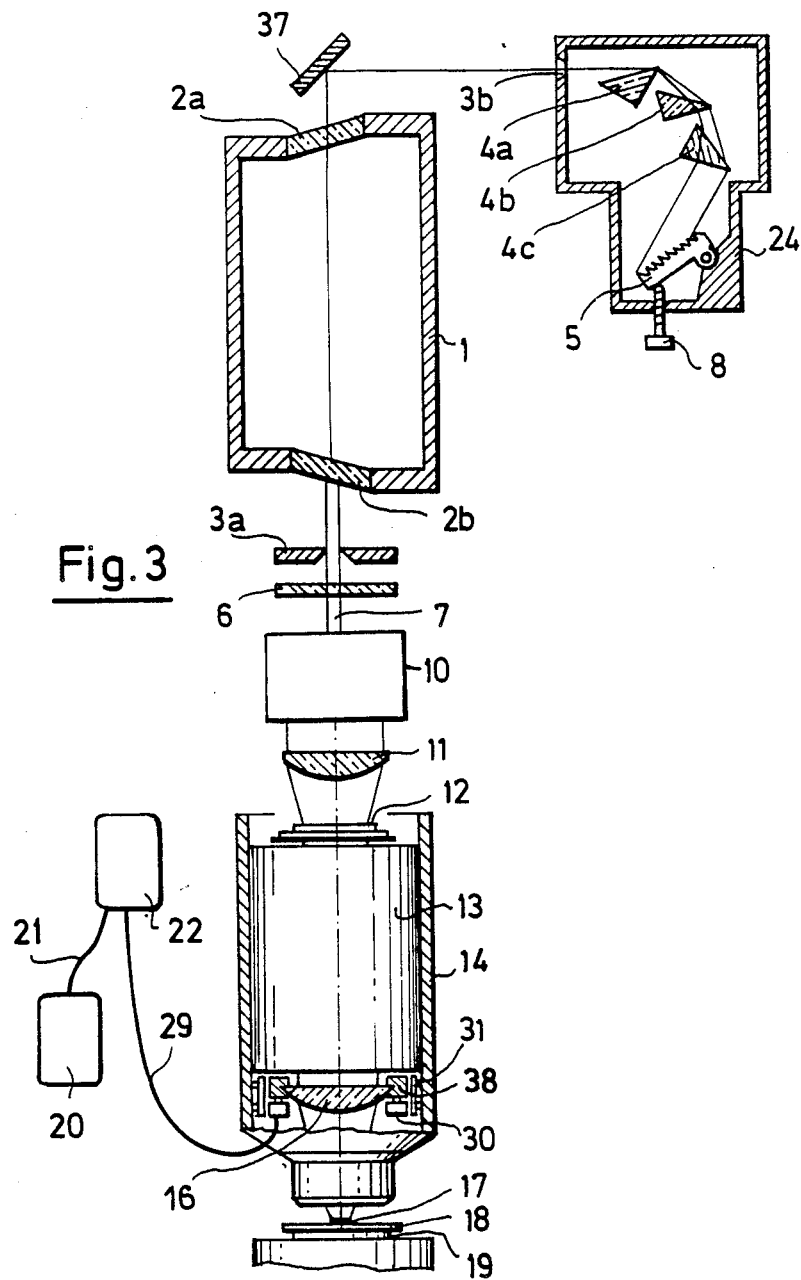
FIG. 3 is a third embodiment of the invention wherein compensation is provided by adjusting an element in the imaging system of a wafer stepper; and, FIG. 4 is a fourth embodiment of the invention wherein the compensation is provided by controlling the wavelength of the laser.

In the embodiment of FIG. 3, the effect of the environmental parameters on the image quality is compensated by an adjustment in elevation of a lens 16 in the frame 38 by means of piezoelectric crystal lifters 30 with the movement held within tight tolerances by means of a lateral lens guide 31. The signals for adjusting the elevation are transmitted via a connecting cable 29 from the positioning-quantity computer 22 to the piezoelectric crystal lifters 30. Generally, the last lens 16 in the imaging optics must not be changed in elevation; rather, the particular lens or lens group will be selected which effects the desired compensation best.

Figure 4:
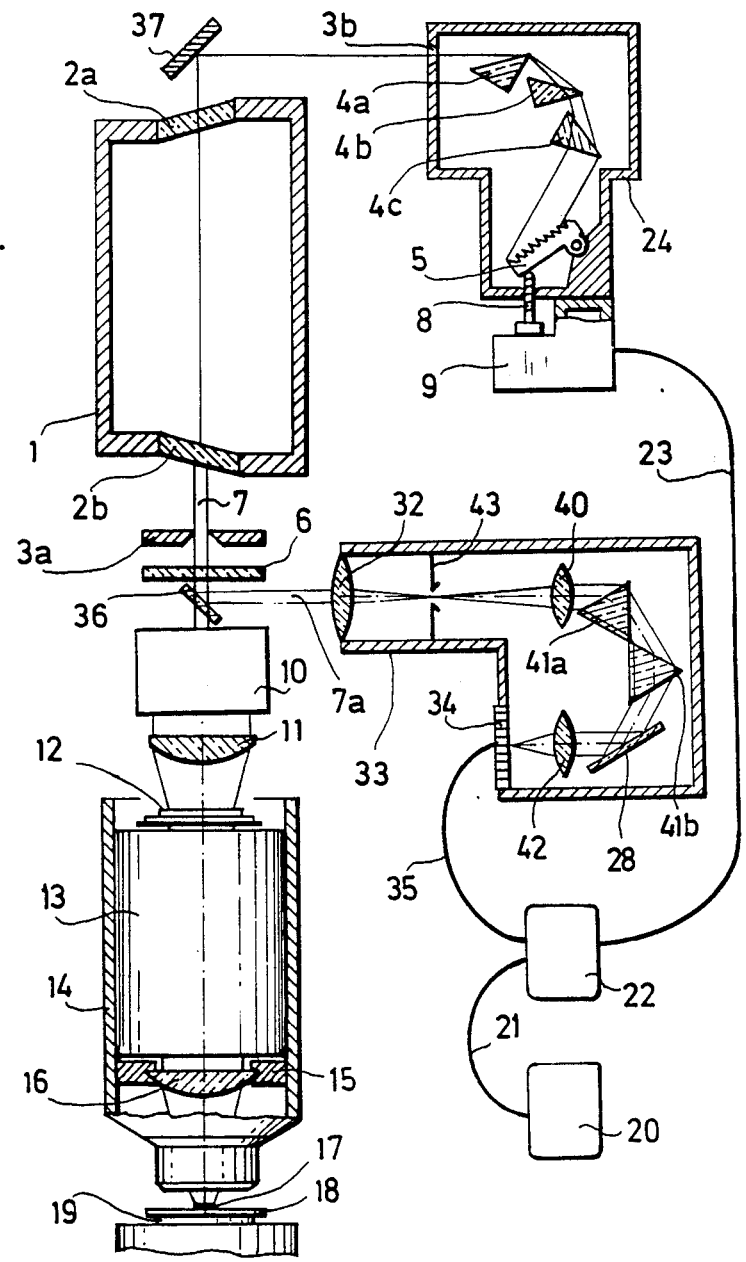

A further embodiment of the invention is shown in FIG. 4 wherein the measuring device 20 measures the environmental parameters and transmits the appropriate signals via the cable 21 to the positioning-quantity computer 22. Downstream of the out-coupling mirror 6, a portion of the laser beam is imaged on a spectrometer 33 by means of a beam splitter 36. For this purpose and upstream of the spectrometer 33 per se, the out-coupled laser beam 7a is focused on the entry slit 43 by means of lens 32. After a parallel radiation is generated by means of lens 40, the radiation is dispersed by prisms (41a, 41b) and imaged via a mirror 28 and a lens 42 onto a diode array 34 which transmits the wavelength directly as a signal to the positioning-quantity computer 22 via the connecting cable 35. The positioning-quantity computer 22 computes a correction signal from the deviation from the desired value. This correction signal is transmitted to the positioning motor 9 of the adjusting screw 8 via the connecting cable 23. It is understood that an adjustment of the object and image planes or a displacement in elevation of one or more lenses of the objective 13 can be carried out as a corrective measure in the context of FIGS. 2 and 3.

The spectrometer 33 to be utilized is dependent from the required resolution and is not limited to the spectrometer 33 shown here. The beam splitter 36 can remain continuously in the beam path as conditions may require or it can be folded or displaced out of the beam path during radiation in order not to reduce the maximum radiation intensity.

The spectrometer shown in FIG. 4 is configured as a prism spectrometer 33 whose prisms are made of the same material as the lenses of the objectives (13, 16). The wavelength of laser 1 is then to be controlled such that the radiation always impinges at the same location of the diode array.

In the embodiments described above, consideration was only given to one environmental parameter. It is also possible to provide several compensation systems so that several environmental parameters can be considered at the same time. These compensation systems then preferably actuate different adjusting elements in the sense of FIGS. 1 to 3 or are limited to the most suitable one.

It is understood that the foregoing description is that of the preferred embodiments of the invention and that various changes and modifications may be made thereto without departing from the spirit and scope of the invention as defined in the appended claims.

What is claimed is:

1. A method for compensating for the influence of environmental parameters on the imaging characteristics of a system for imaging an original into an image plane by utilizing narrow-band radiation having a predetermined wavelength, the method comprising the steps of:
   first determining the influence of at least one of the environmental parameters on the imaging characteristics and storing the same in the form of stored values;
   continuously measuring said at least one environmental parameter during operation of the system;

converting one at least one environmental parameter into a positioning quantity by means of said stored values for readjusting the wavelength of the radiation of said system so as to cause the original to be imaged precisely into said image plane; and, influencing a part of said system with said positioning quantity so as to cause said imaging characteristics to be maintained constant with a high precision.

2. The method of claim 1, wherein: said one environmental parameter is air pressure.

3. The method of claim 1, wherein: said one environmental parameter is temperature.

4. The method of claim 1, wherein: said one environmental parameter is humidity.

5. A method for compensating for the influence of environmental parameters on the imaging characteristics of a system for imaging an original into an image plane by utilizing narrow-band radiation, the method comprising the steps of:

first determining the influence of at least one of the environmental parameters on the imaging characteristics and storing the same in the form of stored values;

forming a desired value of the wavelength of the radiation in the imaging system from said stored values and storing said desired value;

continuously measuring said wavelength and said at least one environmental parameter during operation of the system to obtain respective actual values thereof;

comparing the actual value of the wavelength to the stored desired value of the wavelength;

forming a control signal from said comparison of said actual and desired values of the wavelength;

applying said control signal to readjust said wavelength so as to cause the original to be imaged precisely into the image plane;

converting said at least one environmental parameter into a positioning quantity by means of said stored values; and, influencing a part of said system with said positioning quantity so as to cause said imaging characteristics to be maintained constant with a high precision.

6. A method for compensating for the influence of environmental parameters on the imaging characteristics of a system for imaging an original into an image plane by utilizing narrow-band radiation having a predetermined wavelength, the method comprising the steps of:

first determining the influence of at least one of the environmental parameters on the imaging characteristics and storing the same in the form of stored values;

continuously measuring said at least one environmental parameter during operation of the system;

converting said at least one environmental parameter into a positioning quantity by means of said stored values for varying the spacing between the original and the image plane so as to cause the original to be imaged precisely into the image plane.

7. The method of claim 6, wherein: said one environmental parameter is air pressure.

8. The method of claim 6, wherein: said one environmental parameter is temperature.

9. The method of claim 6, wherein: said one environmental parameter is humidity.

10. A method for compensating for the influence of environmental parameters on the imaging characteristics of a system for imaging an original into an image plane by utilizing narrow-band radiation having a predetermined wavelength, the method comprising the steps of:

first determining the influence of at least one of the environmental parameters on the imaging characteristics and storing the same in the form of stored values;

continuously measuring said at least one environmental parameter during operation of the system;

converting said at least one environmental parameter into a positioning quantity by means of said stored values for adjusting the position of an element of said system influencing the imaging so as to cause the original to be imaged precisely into the image plane.

11. The method of claim 10, wherein: said one environmental parameter is air pressure.

12. The method of claim 10, wherein: said one environmental parameter is temperature.

13. The method of claim 10, wherein: said one environmental parameter is humidity.

14. An apparatus for compensating for the influence of environmental parameters on the imaging characteristics of a system for imaging an original into an image plane by utilizing narrow-band radiation; the system including a laser radiation source for illuminating the original with radiation defining a radiation path and an optical arrangement arranged in said path for imaging the original on the surface of a workpiece; the apparatus comprising:

an adjustable monochromator including a wavelength setting member for setting the wavelength of said radiation and a positioning motor for moving said member for varying said wavelength;

a measuring device for measuring at least one of the environmental parameters and producing a measurement signal indicative of the measurement; and, a positioning-quantity computer for receiving said measurement signal and computing an output for driving said positioning motor to effect a movement of said wavelength setting member thereby effecting a change of the wavelength of the radiation to compensate for the disadvantageous influence of the measured environmental parameter on the imaging quality.

15. The apparatus of claim 14, comprising: a deflecting member arranged in said radiation path for deflecting a predetermined portion of said radiation out of said path to form a component beam; a spectrometer having a signal generator receiving said component beam for generating a wavelength signal proportional to the actual value of the wavelength of said radiation; and, said positioning-quantity computer having an input for receiving said wavelength signal.

16. The apparatus of claim 15, said optical arrangement including a plurality of optical elements all made of the same material; and, said spectrometer being a prism spectrometer having a plurality of prisms made of the same material as said optical elements of said optical arrangement.

* * * * *

UNITED STATES PATENT AND TRADEMARK OFFICE
CERTIFICATE OF CORRECTION

PATENT NO. : 4,961,001

DATED : October 2, 1990

INVENTOR(S) : Jürgen Liegel and Martin Krautter

It is certified that error appears in the above-identified patent and that said Letters Patent is hereby corrected as shown below:

In the title page, in column 1 under U.S. Patent Documents, line 4: delete "4,666,723" and substitute -- 4,666,273 -- therefor.

In column 3, line 1: delete "200 mJ.250" and substitute -- 200m J • 250 -- therefor.

In column 7, line 1: delete "one" and substitute -- said -- therefor.

Signed and Sealed this

Seventeenth Day of March, 1992

Attest:

HARRY F. MANBECK, JR.

*Attesting Officer*      *Commissioner of Patents and Trademarks*